(12) United States Patent
Regazzi et al.

(10) Patent No.: US 11,664,812 B2
(45) Date of Patent: May 30, 2023

(54) PRECISION MICROWAVE FREQUENCY SYNTHESIZER AND RECEIVER WITH DELAY BALANCED DRIFT CANCELING LOOP

(71) Applicant: Giga-tronics Incorporated, Dublin, CA (US)

(72) Inventors: John R. Regazzi, San Ramon, CA (US); Charles Lewis, San Ramon, CA (US); Carlos Fuentes, Santa Clara, CA (US)

(73) Assignee: Giga-tronics Incorporated, Dublin, CA (US)

( * ) Notice: Subject to any disclaimer, the term of this patent is extended or adjusted under 35 U.S.C. 154(b) by 173 days.

(21) Appl. No.: 16/951,658

(22) Filed: Nov. 18, 2020

(65) Prior Publication Data

US 2021/0091775 A1    Mar. 25, 2021

Related U.S. Application Data

(60) Division of application No. 16/724,929, filed on Dec. 23, 2019, now Pat. No. 10,848,163, which is a
(Continued)

(51) Int. Cl.
*H03L 7/16* (2006.01)
*H04W 76/00* (2018.01)
(Continued)

(52) U.S. Cl.
CPC .............. *H03L 7/16* (2013.01); *H03B 21/01* (2013.01); *H03K 5/159* (2013.01); *H04B 1/16* (2013.01);
(Continued)

(58) Field of Classification Search
CPC .......... H03L 7/16; H03B 21/01; H03K 5/159; H03K 2005/00058; H04B 1/16
(Continued)

(56) References Cited

U.S. PATENT DOCUMENTS

| | | | |
|---|---|---|---|
| 5,748,047 A * | 5/1998 | Guthrie | H03B 21/02 455/314 |
| 7,215,167 B1 * | 5/2007 | Hassun | H03L 7/16 327/158 |

(Continued)

OTHER PUBLICATIONS

"Design of an Active-inductor Dual-loop Frequency Synthesizer"; Sinha et al.; 2004 (Year: 2004).*
(Continued)

*Primary Examiner* — Benjamin H Elliott, IV
(74) *Attorney, Agent, or Firm* — Larry E. Henneman, Jr.; Henneman & Associates, PLC

(57) ABSTRACT

An example frequency converter includes a drift canceling loop with a balanced delay and a linear signal path (e.g., linear with respect to frequency scaling, amplitude modulation, and/or phase modulation). One side of the drift canceling loop includes a fixed delay, and the opposite side includes an adjustable, complementary delay. The adjustable, complementary delay facilitates precision matching of the signal delays on each side of the loop over a range of frequencies, which results in a significant improvement in noise cancelation, particularly at large offsets to the carrier, while permitting the use of a higher noise, but very fast tuning course scale oscillator. The linear signal path from the signal generator to an RF output facilitates modulation of the signal by the signal generator. A modular format is an advantageous embodiment of the invention that includes the removal of the frequency synthesizer's low phase noise reference into a separate module.

18 Claims, 9 Drawing Sheets

Related U.S. Application Data continuation of application No. 15/636,515, filed on Jun. 28, 2017, now Pat. No. 10,560,110.

(60) Provisional application No. 62/355,553, filed on Jun. 28, 2016.

(51) Int. Cl.
*H03B 21/01* (2006.01)
*H03K 5/159* (2006.01)
*H04B 1/16* (2006.01)
*H04B 7/212* (2006.01)
*H03K 5/00* (2006.01)

(52) U.S. Cl.
CPC .......... *H04B 7/2121* (2013.01); *H04W 76/00* (2013.01); *H03K 2005/00058* (2013.01); *H04J 2203/0069* (2013.01); *H04Q 2213/394* (2013.01)

(58) Field of Classification Search
CPC .... H04B 7/2121; H04B 1/0475; H04B 1/525; H04W 76/00; H04J 2203/0069; H04Q 2213/394; H03D 7/161
See application file for complete search history.

(56) References Cited

U.S. PATENT DOCUMENTS

| | | | | |
|---|---|---|---|---|
| 10,560,110 B1* | 2/2020 | Regazzi | ............... | H04B 1/525 |
| 10,848,163 B2* | 11/2020 | Regazzi | ............... | H04W 76/00 |
| 2002/0039885 A1* | 4/2002 | Weissman | ............... | H04B 7/155 |
| | | | | 455/11.1 |
| 2002/0196088 A1* | 12/2002 | Cuddy | ............... | G01R 31/2837 |
| | | | | 331/38 |
| 2004/0203528 A1* | 10/2004 | Ammar | ............... | H01Q 21/0087 |
| | | | | 455/90.3 |
| 2008/0048733 A1* | 2/2008 | Hassun | ............... | H03L 7/23 |
| | | | | 327/105 |
| 2009/0156150 A1* | 6/2009 | Deleon | ............... | H03L 7/183 |
| | | | | 375/376 |
| 2011/0175682 A1* | 7/2011 | Chen | ............... | H03L 7/1075 |
| | | | | 331/17 |
| 2012/0099678 A1* | 4/2012 | Chang | ............... | H03L 7/00 |
| | | | | 375/340 |
| 2014/0015572 A1* | 1/2014 | Nicholls | ............... | H03L 7/185 |
| | | | | 327/119 |
| 2014/0016727 A1* | 1/2014 | Simon | ............... | H04L 27/148 |
| | | | | 375/327 |
| 2014/0241218 A1* | 8/2014 | Moshfeghi | ............... | H04W 84/20 |
| | | | | 370/279 |
| 2015/0293555 A1* | 10/2015 | Fawley | ............... | G06F 1/022 |
| | | | | 327/105 |
| 2016/0126613 A1* | 5/2016 | Leipold | ............... | H04J 1/08 |
| | | | | 333/202 |
| 2020/0127672 A1* | 4/2020 | Regazzi | ............... | H03K 5/159 |
| 2021/0091775 A1* | 3/2021 | Regazzi | ............... | H04B 1/0475 |

OTHER PUBLICATIONS

"Microwave Power Amplifier Fundamentals" (white paper); Fuentes; Oct. 2008 (Year: 2008).*

* cited by examiner

PRECISION MICROWAVE FREQUENCY SYNTHESIZER AND RECEIVER WITH DELAY BALANCED DRIFT CANCELING LOOP

RELATED APPLICATIONS

This application is a divisional of U.S. patent application Ser. No. 16/724,929, filed on Dec. 23, 2019 by at least one common inventor, which is a continuation of U.S. patent application Ser. No. 15/636,515, filed on Jun. 28, 2017 by at least one common inventor, which claims the right of priority to U.S. Provisional Patent Application No. 62/355,553, filed on Jun. 28, 2016 by at least one common inventor, all of which are incorporated herein by reference in their respective entireties.

BACKGROUND OF THE INVENTION

Field of the Invention

This invention relates generally to frequency synthesizers and receivers, and more particularly to frequency synthesizers and receivers in the microwave region.

Description of the Background Art

Frequency synthesizers using noise or drift canceling loops are well known for providing low phase noise and short phase & frequency settling times. However, known synthesizers have been found unsuitable for many applications, such as threat simulation and radar target generation, due to their failure to provide satisfactory signal modulation within the generator and their lack of phase coherent frequency switching characteristics. In other applications, phase stability across multiple frequency synthesizers is important. For example, long term phase stability between channels is required to calibrate direction finding equipment that must operate at great distances. Known synthesizers typically have not adequately addressed situations that require the coordination of multiple channels.

SUMMARY

The present invention overcomes the problems associated with the prior art by providing a frequency synthesizer that is operable in the microwave region and provides significant signal modulation capability in the synthesizer. The synthesizer exhibits low phase noise, is finely tunable (e.g., 1 Hz step size) and can switch frequency in a phase coherent manner within 500 nano-seconds (nsec) or less. The invention facilitates the effective simulation of radar signals for use in testing the effectiveness of radar countermeasure equipment, for generating radar targets for evaluating the radar's resistance to jamming and for calibrating direction finding systems.

An example frequency synthesizer (up-converter) includes a drift canceling loop with a balanced delay and a linear signal path (e.g., linear with respect to frequency scaling, amplitude modulation, and/or phase modulation). In particular, one side of the drift canceling loop includes a fixed delay, and the opposite side of the drift canceling loop includes an adjustable, complementary delay. The adjustable, complementary delay facilitates precision matching of the signal delays on each side of the loop over a range of frequencies, which results in a significant improvement in noise cancelation, particularly at large offsets to the carrier while permitting the use of a higher noise, but very fast tuning course scale oscillator. The linear signal path from the signal generator to an RF output facilitates modulation of the signal by the signal generator. A modular format is considered an advantageous embodiment of the invention, which includes the removal of the frequency synthesizer's low phase noise reference into a separate module.

An example receiver (down-converter) including a drift canceling loop with a balanced delay and a linear signal path is also disclosed.

An example signal converter includes a first mixer, a second mixer, a variable oscillator, a splitter, a delay device, and a complementary delay device. The first mixer includes an input for receiving a signal to be converted, and the second mixer includes an output for providing the converted signal. The variable oscillator produces a signal (CS) variable at a first scale (e.g., frequency step resolution). The splitter is coupled to the first mixer and the second mixer to form a drift canceling loop. The splitter includes an input coupled to receive the signal (CS) from the variable oscillator, a first output coupled to introduce the signal (CS) into the drift canceling loop along a first direction, and a second output coupled to introduce the signal (CS) into the drift canceling loop along a second direction opposite the first direction. The delay device is coupled between the second output of the splitter and an input of the second mixer, and a complementary delay device is coupled between the first output of the splitter and an input of the first mixer. At least one of the delay device and the complementary delay device is adjustable. In one example embodiment, the signal received by the first mixer is downconverted. In another example embodiment, the signal received by the first mixer is upconverted.

In a disclosed embodiment, the signal path from the input of the first mixer to the output of the second mixer is linear (e.g., linear with respect to frequency scaling, amplitude modulation, and/or phase modulation).

The example signal converter further includes a second variable oscillator and a third mixer. The second variable oscillator produces a signal (FS) variable at a second scale finer than the first scale (e.g., finer step-wise adjustment of frequency). The third mixer is coupled between the splitter and the first mixer and has an input coupled to receive the signal (FS) from the second variable oscillator.

In a particular embodiment, the complementary delay device introduces an adjustable delay to signals passing therethrough, and the delay device introduces a fixed delay to signals passing therethrough. The delay device introduces a delay in one side of the drift canceling loop that exceeds by a predetermined amount a delay that would occur in an opposite side of the drift canceling loop without the complementary delay device. The complementary delay device is adjustable over a range sufficient to balance the delays on both sides of the drift canceling loop for a predetermined range of signal frequencies. A controller is coupled to the complementary delay device and is operative to adjust the complementary delay device based at least in part on a current frequency of the variable oscillator and a current frequency of the second variable oscillator.

The example signal converter optionally includes a slave output and a second slave output. The slave output is coupled to provide a signal (LO1) from a second input of the first mixer to a slave converter. The second slave output is coupled to provide a signal (LO2) from an input of the second mixer to the slave converter.

An example slave converter includes a first mixer and a second mixer, but does not include a drift canceling loop.

Instead, the first mixer includes an input for receiving a second signal to be converted and a second input coupled to the slave output. The second mixer includes an output for providing the converted second signal and an input coupled to the second slave output.

Optionally, the signal converter can include a plurality of the slave converters. Each of the slave converters includes a first mixer and a second mixer, but does not include a drift canceling loop. Instead, the first mixer includes an input for receiving a respective signal to be converted and a second input coupled to receive the signal (LO1) from the slave output of the master portion of the signal converter. The second mixer includes an output for providing the respective converted signal and an input coupled to receive the signal (LO2) from the second slave output of the master portion of the signal converter.

An example modular converter system is also disclosed. The example modular system includes a mounting structure adapted to receive one or more master converter modules and one or more slave converter modules. The system further includes a reference signal generator, reference connectors, slave connectors, a data interface, and a control interface. The reference signal generator is mountable in the mounting structure (e.g., housing, cabinet, rack, etc.) and operable to generate at least one reference signal (R2). The reference connectors are disposed in the mounting structure and coupled to provide the at least one reference signal (R2) to any master converter modules present in the mounting structure. The slave connectors are coupled to provide slave signals from the one or more master converter modules to associated ones of the one or more slave control modules. The data interface is operative to communicate signals to be converted to the one or more master converters and to the one or more slave converters. The control interface is operative to communicate frequency control signals to the one or more master converter modules.

The modular converter system can include one or more of the master converter modules, each the master converter module including a master signal converter. Each master signal converter includes a first mixer, a second mixer, a variable oscillator, a splitter, a second variable oscillator, a third mixer, a slave output and a second slave output. The first mixer includes an input coupled to the data interface for receiving a signal to be converted. The second mixer includes an output for providing the converted signal. The variable oscillator produces a signal (CS) variable at a first scale (e.g., frequency step resolution). The splitter is coupled to the first mixer and the second mixer to form a drift canceling loop. The splitter includes an input coupled to receive the signal (CS) from the variable oscillator, a first output coupled to introduce the signal (CS) into the drift canceling loop along a first direction, and a second output coupled to introduce the signal (CS) into the drift canceling loop along a second direction opposite the first direction. The second variable oscillator is coupled to receive the reference signal (R2) via the reference connectors and is operative to produce a signal (FS) variable at a second scale, finer than the first scale, depending on the reference signal (R2). The third mixer is coupled between the splitter and the first mixer and has an input coupled to receive the signal (FS) from the second variable oscillator. The slave output is coupled to provide a slave signal (LO1) from a second input of the first mixer (to a slave module) via one of the slave connectors, and the second slave output is coupled to provide a second slave signal (LO2) from an input of the second mixer (to the same slave module) via another of the slave connectors.

The example modular converter system additionally includes one or more of the slave converter modules, each the slave converter module including a slave signal converter. Each slave signal converter includes a first mixer and a second mixer, but not a drift canceling loop. The first mixer includes an input for receiving an associated signal to be converted and a second input coupled to receive a slave signal (LO1) via an associated one of the slave connectors. The second mixer includes an output for providing the converted second signal and an input coupled to receive a second slave signal (LO2) via another associated one of the slave connectors. Optionally, each slave converter module can include a plurality of the slave signal converters.

In an even more particular embodiment, the reference signal generator is operative to generate another reference signal (R1), and the reference connectors are coupled to provide the reference signal (R1) to any master converter modules present in the mounting structure. In addition, each master signal converter includes a fourth mixer and a harmonic generator. The fourth mixer is coupled between the splitter and the third mixer. The harmonic generator has an input coupled to receive the reference signal (R1), via an associated one of the reference connectors, and has an output coupled to an input of the fourth mixer. The electrical path length of every said reference connector communicating said reference signal (R1) is the same, and the electrical path length of every said reference connector communicating said reference signal (R2) is the same. Optionally, the electrical path length of every said reference connector communicating said reference signals (R1) and (R2) is the same.

In an example modular converter system, the master signal converter additionally includes a delay device and a complementary delay device. The delay device is coupled between the second output of the splitter and an input of the second mixer. The complementary delay device is coupled between the first output of the splitter and an input of the first mixer. At least one of the delay device and the complementary delay device is adjustable. In a particular embodiment, the complementary delay device is adjusted based at least in part on a current frequency of the variable oscillator and a current frequency of the second variable oscillator.

Optionally, one of the slave converter modules includes at least three slave signal converters, one of the master converter module includes no more than one master signal converter, and the slave converter module is no larger than the master converter module.

BRIEF DESCRIPTION OF THE DRAWINGS

The present invention is described with reference to the following drawings, wherein like reference numbers denote substantially similar elements.

DETAILED DESCRIPTION

The present invention overcomes the problems associated with the prior art, by providing a frequency converter (synthesizer or receiver) that includes a drift canceling loop with a balanced delay and a linear signal path (e.g., in the up-converter). In the following description, numerous specific details are set forth (e.g., oscillator frequencies, filter frequencies, delay values, etc.) in order to provide a thorough understanding of the invention. Those skilled in the art will recognize, however, that the invention may be practiced apart from these specific details. In other instances, details of well-known microwave synthesizer components, design, and use have been omitted, so as not to unnecessarily obscure the present invention.

Several aspects of the present invention will be apparent to those skilled in the art based on the content of the drawings, which alone will enable a person of ordinary skill in the art to make and use the disclosed inventions without undue experimentation. The drawings present illustrative example embodiments, and should not be construed as limiting the scope of the inventions. The following comments provide additional clarification of some features and additional aspects of the inventions.

Figure 1:
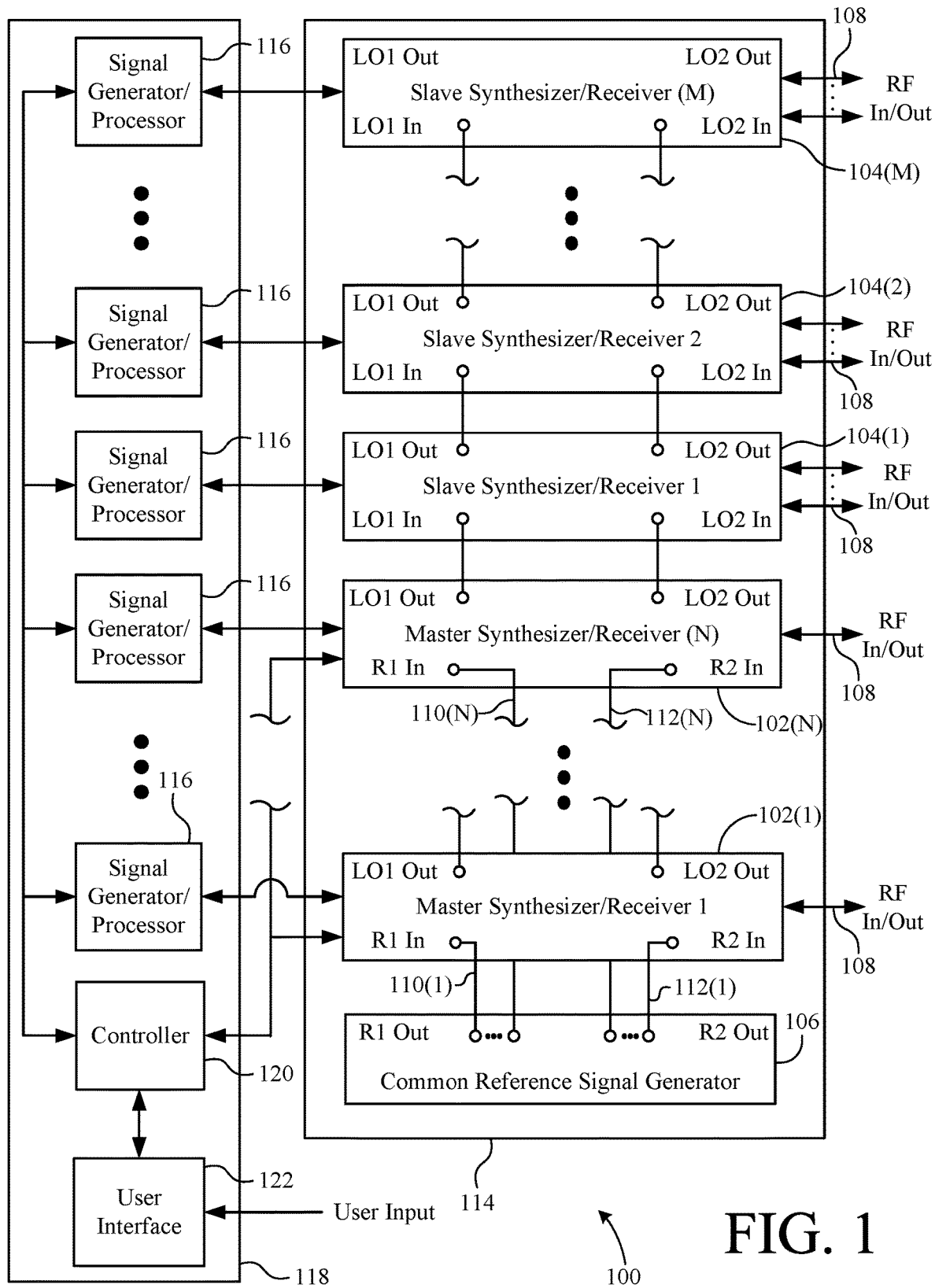
FIG. 1 is a block diagram of a master-slave system of synthesizers (up-converters) and/or receivers (down-converters)

FIG. 1 is a block diagram of an example master-slave modular system of synthesizers/receivers 100. A plurality of master synthesizers/receivers 102(1-N), a plurality of slave up/down-converters 104(1-M), and a common reference 106 are coupled together to provide a plurality of coherent RF outputs/inputs 108. In this example, one master circuit (e.g., a master up-converter of FIG. 2 or FIG. 9, or a master down-converter of FIG. 4 or FIG. 10) is included in each master module, and a plurality (e.g., 3) of slave up/down-converter circuits (e.g., the slave up-converter of FIG. 7 or the slave down-converter of FIG. 8) is included in each slave module. In this example, all of master synthesizers 102(1-N) are driven by the R1 and R2 reference signals provided by common reference 106, and slave up/down-converters 104(1-M) are driven by the LO1 and LO2 signals provided by master 102(N). However, each of masters 102(1-N) can drive a plurality of slave circuits 104(1-M), if desired.

Common reference 106 provides the R1 and R2 signals to each master module 102(1-N) via a separate set of conductors 110(1-N) and 112(1-N), respectively (reference connectors). All of conductors 110(1-N) conveying the R1 signals from common reference 106 to master modules 102(1-N) are of equal electrical length, and all of the conductors 112(1-N) conveying the R2 signals from common reference 106 to master modules 102(1-N) are of equal electrical length. Optionally, the electrical length of conductors 110(1-N) carrying the R1 signals is the same as the electrical length of conductors 112(1-N) carrying the R2 signals. The equal electrical length of conductors 110(1-N) and 112(1-N) carrying the R1 and R2 signals, respectively, ensures that any phase drift (e.g., due to temperature change) in the RF outputs of the system will be the same and, therefore, the relative phases of the RF outputs will not change. In the example embodiment, equal length conductors are provided in a mounting structure (e.g., rack/cabinet) 114, wherein master synthesizers/receivers 102(1-N) are also to be mounted.

Each of master synthesizers/receivers 102(1-N) and each slave up/down-converter 104(1-M) receives a signal input from an associated one of a plurality of signal generators/processors 116, which in this example embodiment are shown as separate components, but embodied within a general purpose computer system 118, along with a controller 120 and a user interface 122. Computer system 118 communicates with master synthesizers/receivers 102(1-N) and each slave up/down-converter 104(1-M) via data and control interfaces (e.g. data and/or control busses) housed and coupled within the same rack/cabinet 114 as the master modules 102(1-N) and slave modules 104(1-M). Alternatively, signal generators/processors 116 can be housed within a module mountable within rack/cabinet 114.

In this embodiment, all of master circuits 102(1-N) and slave circuits 104(1-M) are shown as either up-converters or down converters. However, masters 102(1-N) and slaves 104(1-M) could all be down-converters or all up-converters. Indeed, any combination of master up-converters, master down-converters, slave up-converters, and/or slave down-converters could be used together depending on the needs of a particular application.

Calibration of a master converter (up or down) is accomplished by measuring the phase noise of the up-converter (or down-converter, with a suitable low-noise RF Input signal) for each variation of the complementary delay line at a given frequency. A local maxima is searched for within a given delay segment for a particular frequency. After data for all delay segments have been measured, the delay segment with the least amount of phase noise is selected as the nominal complementary delay for a given frequency. An array of this data is then stored within controller 120 as calibration data. Complementary delay data is not needed for slave converters 104(1-M), as slave converters 104(1-M) take on the matched delay performance of the associated one of master converters 102(1-N).

Figure 2:
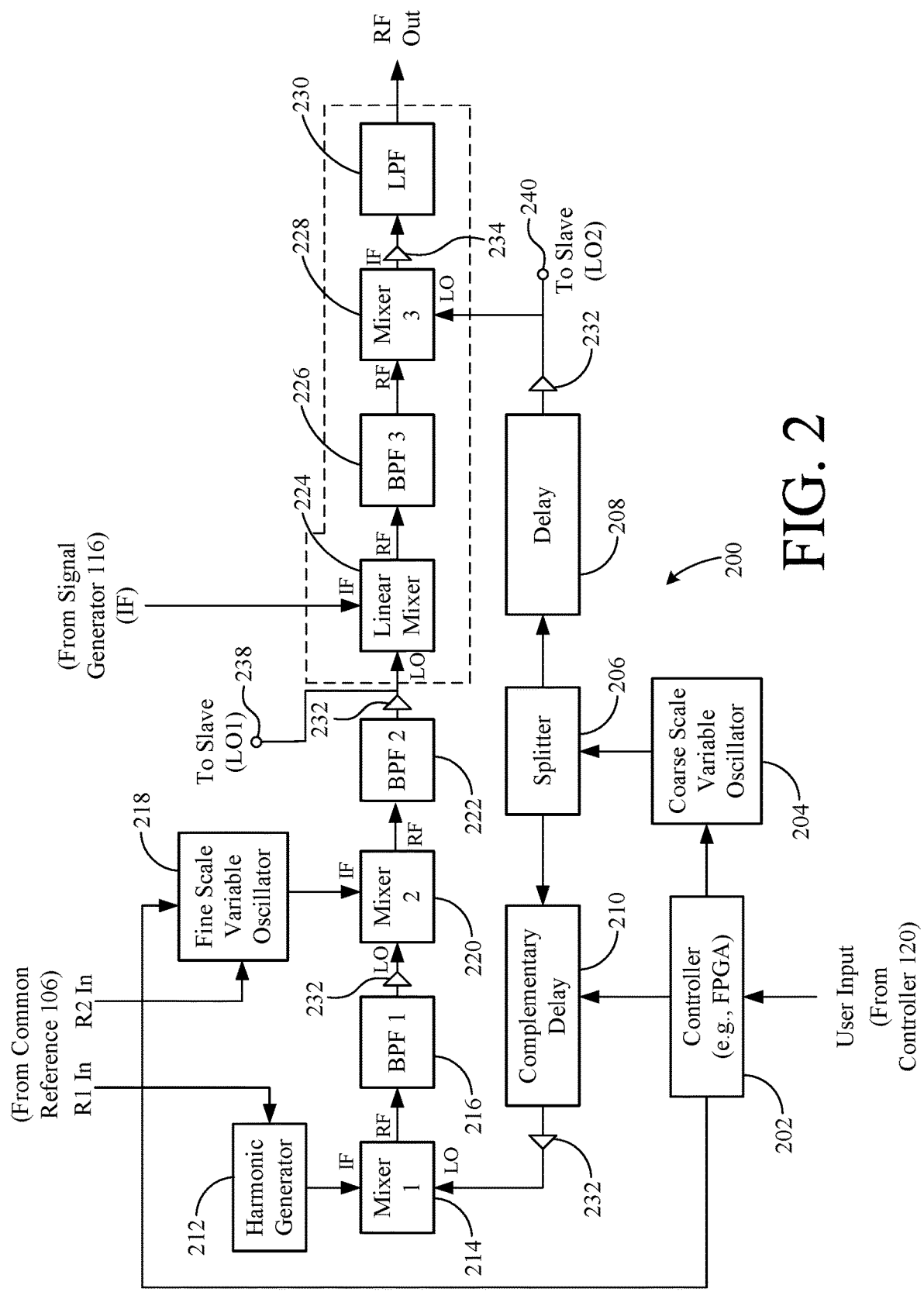
FIG. 2 is a block diagram of an example synthesizer of FIG. 1.

FIG. 2 is a block diagram of an example synthesizer (up-converter) 200, which includes the following components: a controller 202, a course scale variable oscillator 204, a splitter 206, a delay circuit 208, a complementary delay circuit 210, a harmonic generator 212, a first mixer (Mixer 1) 214, a first band-pass filter (BPF 1) 216, a fine scale variable oscillator (FCVO) 218, a second mixer (Mixer 2) 220, a second band-pass filter (BPF 2) 222, a linear mixer 224, a third band-pass filter (BPF 3) 226, a third mixer (Mixer 3) 228, and a low-pass filter (LPF) 230, all interconnected as shown in FIG. 2. The terminals of the mixers are labeled to identify the local oscillator (LO) terminals, the intermediate frequency (IF) terminals, and the radio frequency (RF) terminals. In addition, small triangles are used to represent amplifiers 232, which may be positioned between various components of example frequency generator 102.

User input (e.g., base frequency selection) is provided to controller 202, which can be implemented with a field programmable gate array (FPGA), via controller 120 of system 100 (FIG. 1). Controller 120 can include, for example, a personal computer (PC) communicating with controller 202 via a high speed interface (e.g., PCIe). Responsive to the user input, controller 202 provides a control signal to course scale variable oscillator (CSVO) 204, which generates an output signal having a frequency that depends on the control signal. Splitter 206 receives the output signal from CSVO 204, and communicates the signal to both delay circuit 208 and complementary delay circuit 210. Complementary delay circuit 210 adds an adjustable delay to the signal, based on a control signal received from controller 202, and provides the delayed signal to the LO terminal of first mixer 214. Delay circuit 208 adds a fixed delay to the signal and provides the delayed signal to the LO terminal of third mixer 228. The relationship between the adjustable delay of complementary delay 210 and the fixed delay of delay 208 will be explained in greater detail below.

Harmonic Generator 212 and FSVO 218 receive reference frequency signals (R1 and R2, respectively) from common reference 106 and generate their output based on the reference frequencies (R1 and R2). First mixer 214 mixes the delayed signal with the output of harmonic generator 212 and provides the resulting signal, through first band-pass filter 216, to the LO terminal of second mixer 220. Second mixer 220 combines the filtered signal with a signal from FSVO 218 and provides the combined signal, through second band-pass filter 222 to the LO terminal of linear mixer 224. Linear mixer 224 combines the signal provided to its LO terminal with a signal provided from one of signal generators 116 on its IF terminal and provides the resulting signal, through third band-pass filter 226, to third mixer 228. Third mixer 228 combines the signal from linear mixer 224 with the delayed signal from delay circuit 208, to subtract the original signal from CSVO 204, thereby canceling any frequency/phase drift of CSVO 204. The output of third mixer 228 is provided to RF output 108 through a power amplifier 234 and low-pass filter 230.

FSVO 218 uses an arrangement employing a harmonic generator driven by the R2 frequency reference signal, as will be described in greater detail below with reference to FIG. 4.

A linear path 236 from signal generator 116 to the RF output provides important advantages over the prior art. For example, the linear path facilitates/preserves amplitude, frequency and phase modulation of the signal by/from signal generator 116. Signal generator 116 need operate only over a range of frequencies that is much lower and narrower than the RF output signal, permitting the use of versatile digital techniques, such as FPGAs, deep memories and high speed digital to analog converters to generate the IF input to linear mixer 224. The linear path, along with the flexibility of implementing signal generator 116 using widely available digital techniques, permits generating high fidelity complex modulation waveforms at microwave frequencies. It is also possible to generate the IF input to linear mixer 224 with similar fidelity using analog IQ techniques due to the modulator requiring balance only over a narrow range of operation. The prior art that employs analog IQ modulation directly at the RF output will have difficulty achieving the same level of signal fidelity due to the need to maintain balance of the modulator over the entire operating range of the synthesizer.

Similar advantages are available for the receiver (down-converter). The linear path maintains wide-bandwidths over a select few intermediate frequencies, rather than requiring a plurality of block down-converters that are multiplexed together to cover a broad range of microwave input frequencies as is common in the present art. Using modern digital techniques, the output of the proposed receiver can then be converted either directly into a digital signal, or employ an IQ demodulator as desired.

The relationship between the adjustable delay of complementary delay 210 and the fixed delay of delay 208 also provides important advantages over the prior art, by facilitating more precise control over the timing of the arrival of the signals at third mixer 228 and, therefore, more complete drift/noise cancelation. Complementary delay 210 may also be used to correct for frequency/phase fluctuations as a function of temperature. The fixed delay is selected to exceed the expected delay caused by the signal traversing the clockwise portion of the drift-canceling loop, and complementary delay 210 is finely adjustable to facilitate precision balancing of the clockwise and counter-clockwise delays. For example, in one embodiment, the expected delay caused by the clockwise portion of circuit 102 is determined to be about 5.0 nsec (5,000 psec), but the actual delay is frequency or temperature dependent. Therefore, the delay is configured to be 5.5 nsec (5,500 psec), and the complementary delay ranges from 250 psec to 750 psec and is adjustable in 50 psec increments, depending at least in part on the frequency of the output of CSVO 204.

Common reference 106 can be on the same circuit board as frequency generator 200, or signals R1 and R2 can be provided from an external source, as shown in FIG. 1. When the R1 and R2 signals are provided separately from shared between generators 116, harmonic generator 212 and FSVO 218 within each synthesizer 102(1-N) is receiving the same signal, which greatly enhances the phase stability between channels.

Signal generator 116 can be housed on the same circuit board or in the same housing as frequency generator 200, but is more typically provided as a connected separate component.

Figure 7:
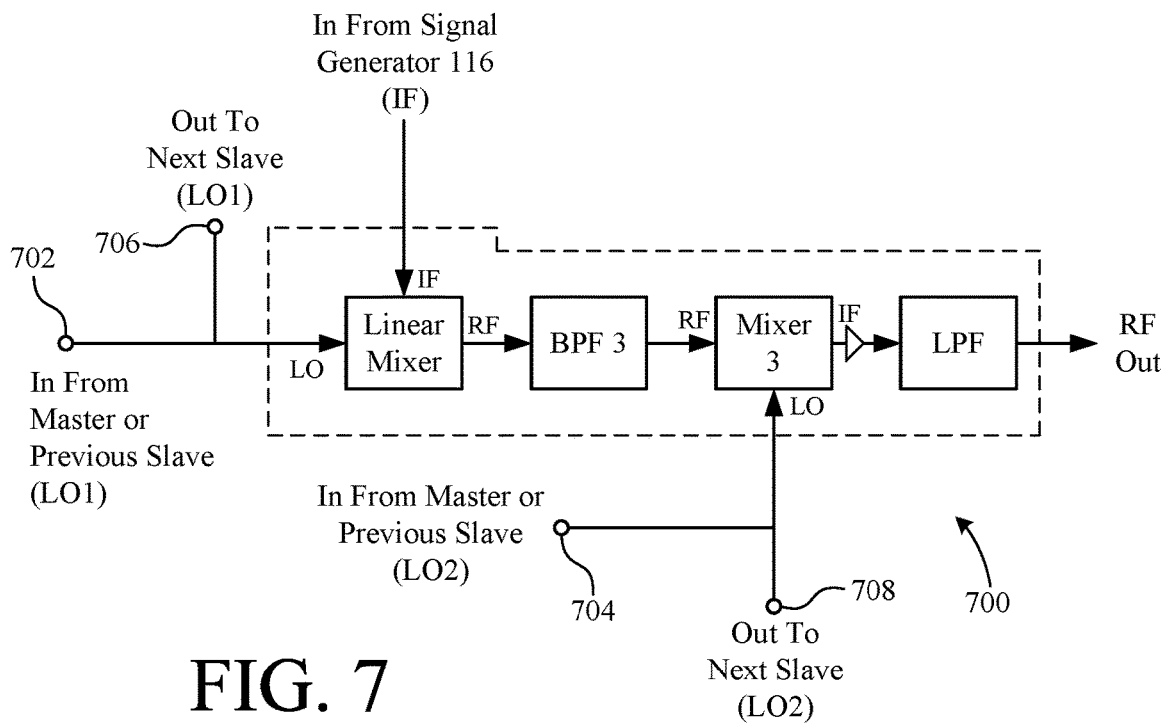
FIG. 7 is a block diagram of an example slave synthesizer of FIG. 1.
Figure 8:
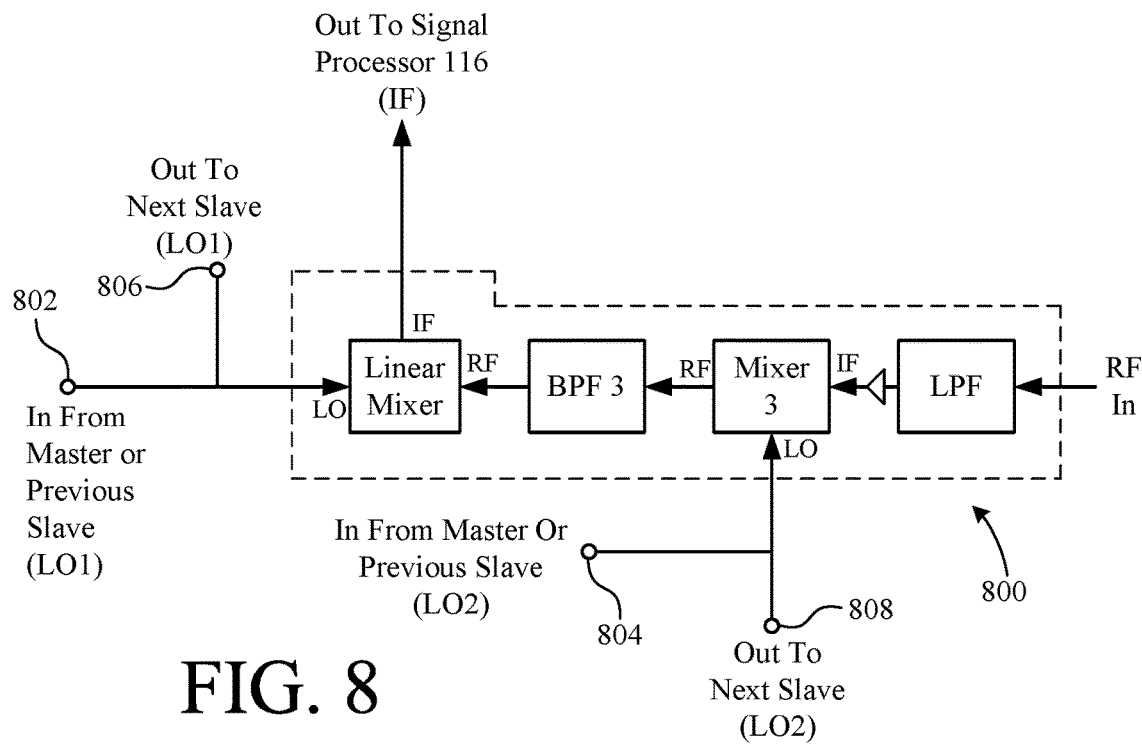
FIG. 8 is a block diagram of an example slave receiver of FIG. 1.

Circuit 200, as shown in FIG. 2, is considered a master circuit, because it includes output terminals 238 and 240 to provide local oscillator signals (LO1 and LO2, respectively) to one or more slave circuits 104, such as, for example, the slave circuits shown in FIG. 7 and/or FIG. 8.

Figure 3:
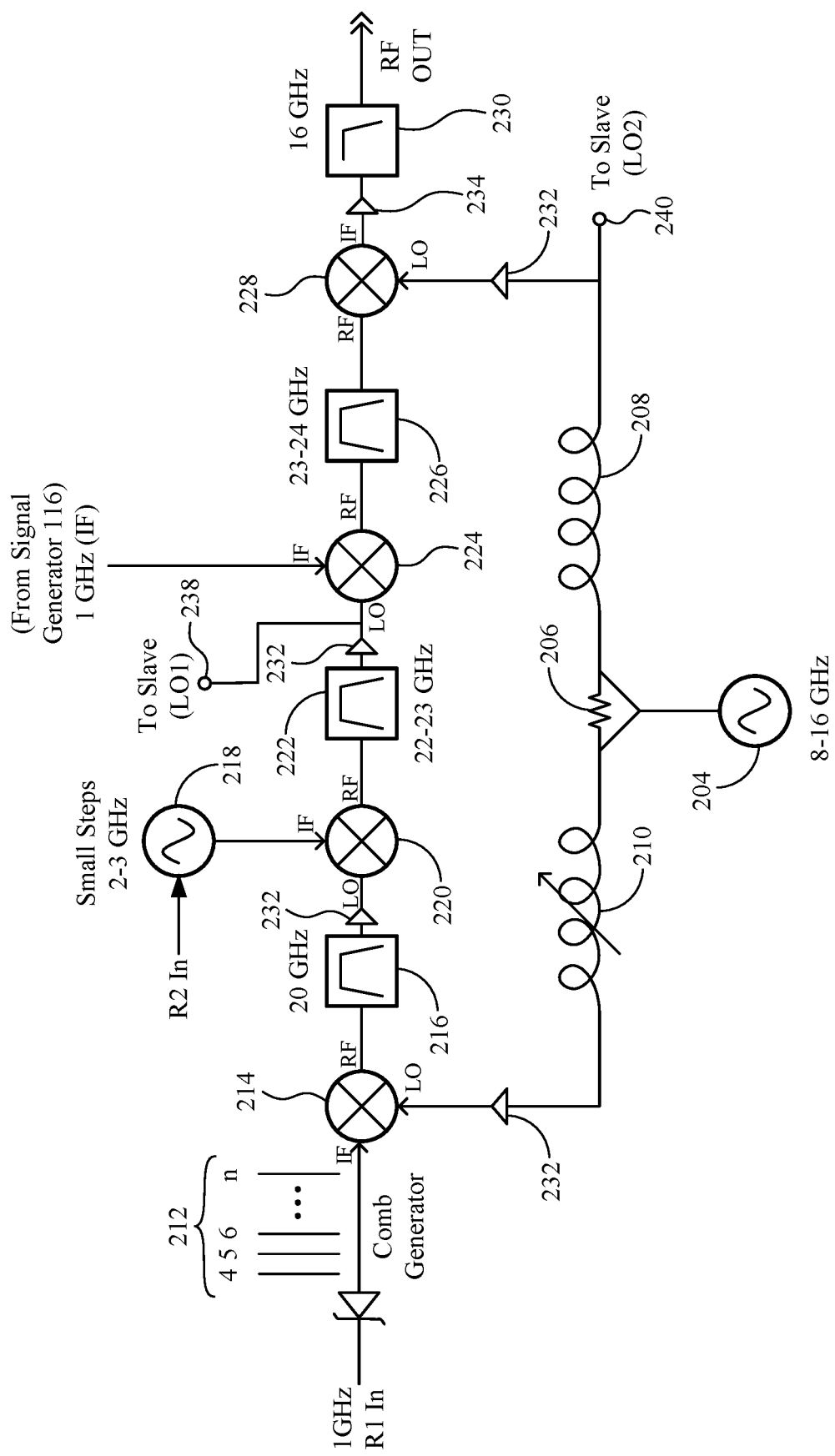
FIG. 3 is a circuit diagram showing specific example components of the synthesizer of FIG. 2.

FIG. 3 is a circuit diagram showing specific, example components of frequency synthesizer 200 of FIG. 2. A 1 GHz crystal is included in common reference 106 (FIG. 1), which provides the reference signals R1 and R2, as shown. In this example embodiment, reference signal R1 is a 1 GHz signal and reference signal R2 is a 200 MHz signal.

Figure 4:
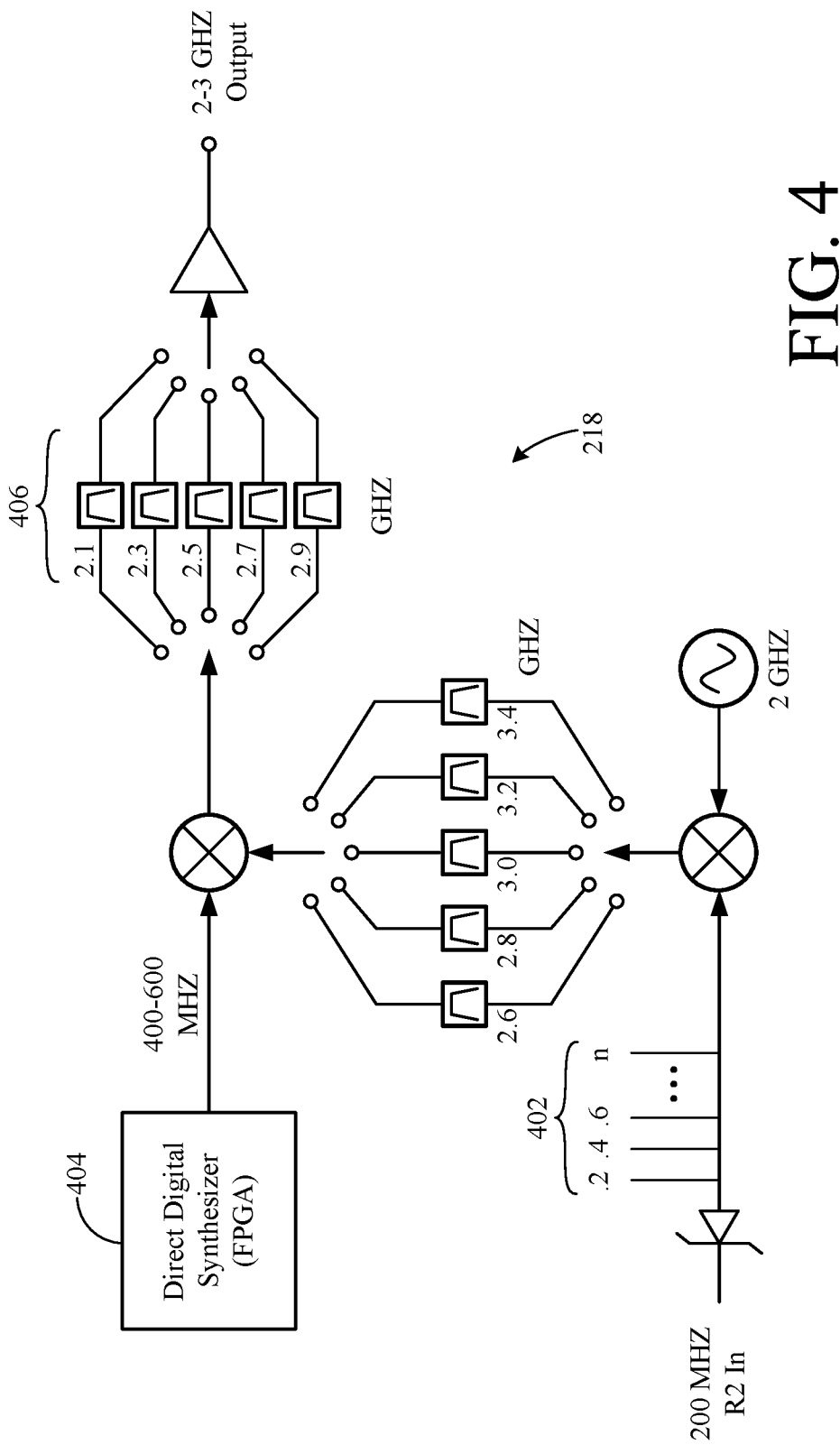
FIG. 4 is a block diagram of the Fine Scale Variable Oscillator (FSVO) of FIGS. 2 and 3.

FIG. 4 is a circuit diagram showing FSVO 218 (FIG. 2). FSVO 218 uses an arrangement employing a harmonic generator 402 driven by the R2 frequency reference signal to generate the LO signals for translating the output of a direct digital synthesizer (DDS) 404 into one of five bands 406. FSVO 218 switches frequency in a phase coherent manner due to the fact that the comb of frequencies produced by harmonic generator 402 is always running and assuming DDS 404 switches in a phase coherent manner. Although a typical DDS normally switches frequency in a phase continuous manner, it is well known how to make a DDS switch phase coherently. Since the contribution of CSVO 204 is cancelled out in drift cancelling designs, the RF output switches in a phase coherent manner, because the comb of frequencies produced by harmonic generator 212 (driven by the R1 frequency reference) is also always running.

Figure 5:
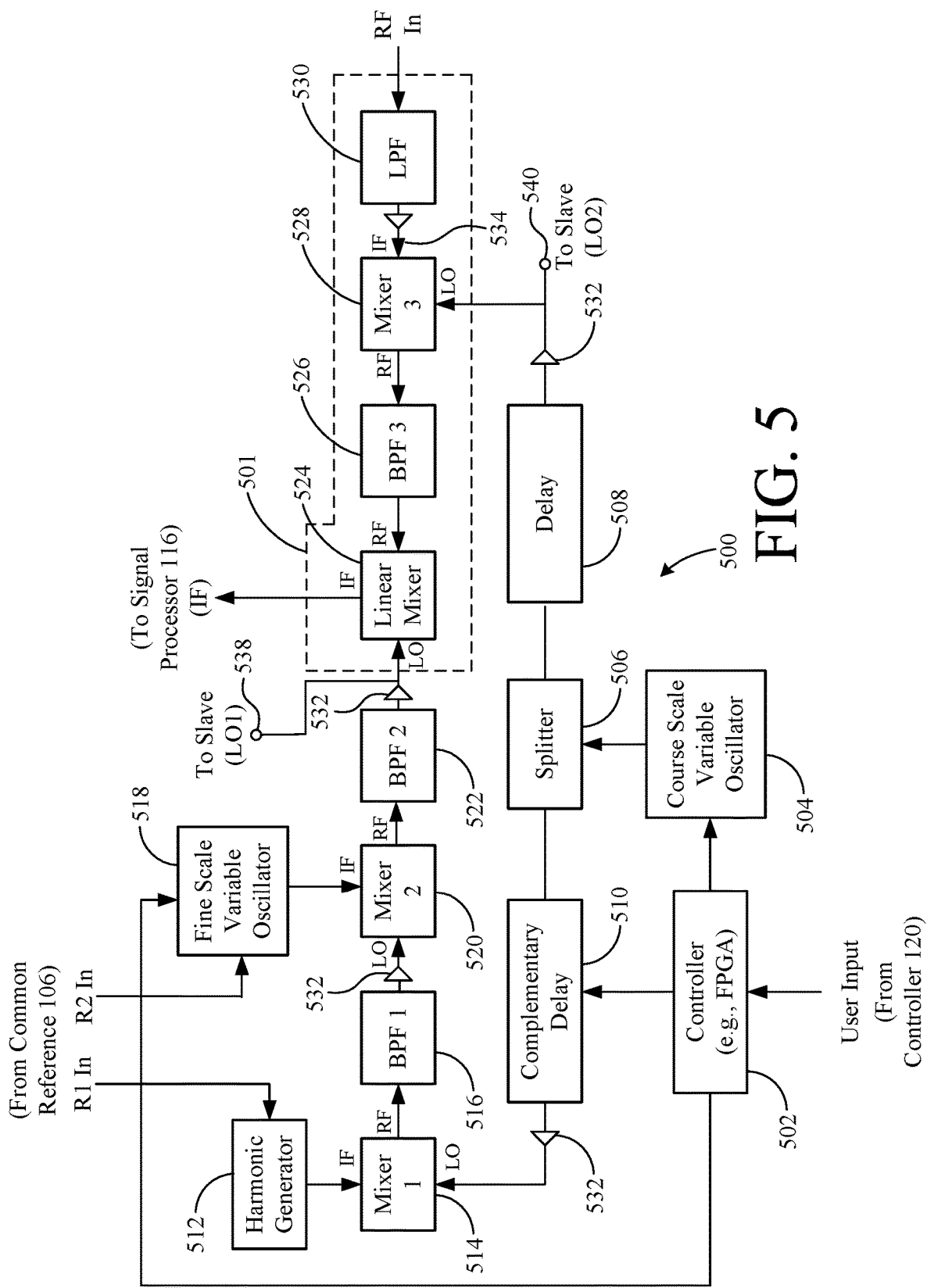
FIG. 5 is a block diagram of an example receiver of FIG. 1.

FIG. 5 is a block diagram of an example receiver (down-converter) 500. Down-converter 500 is similar to up-converter 200, except that the linear path 501 conducts an RF input signal in the opposite direction.

Figure 6:
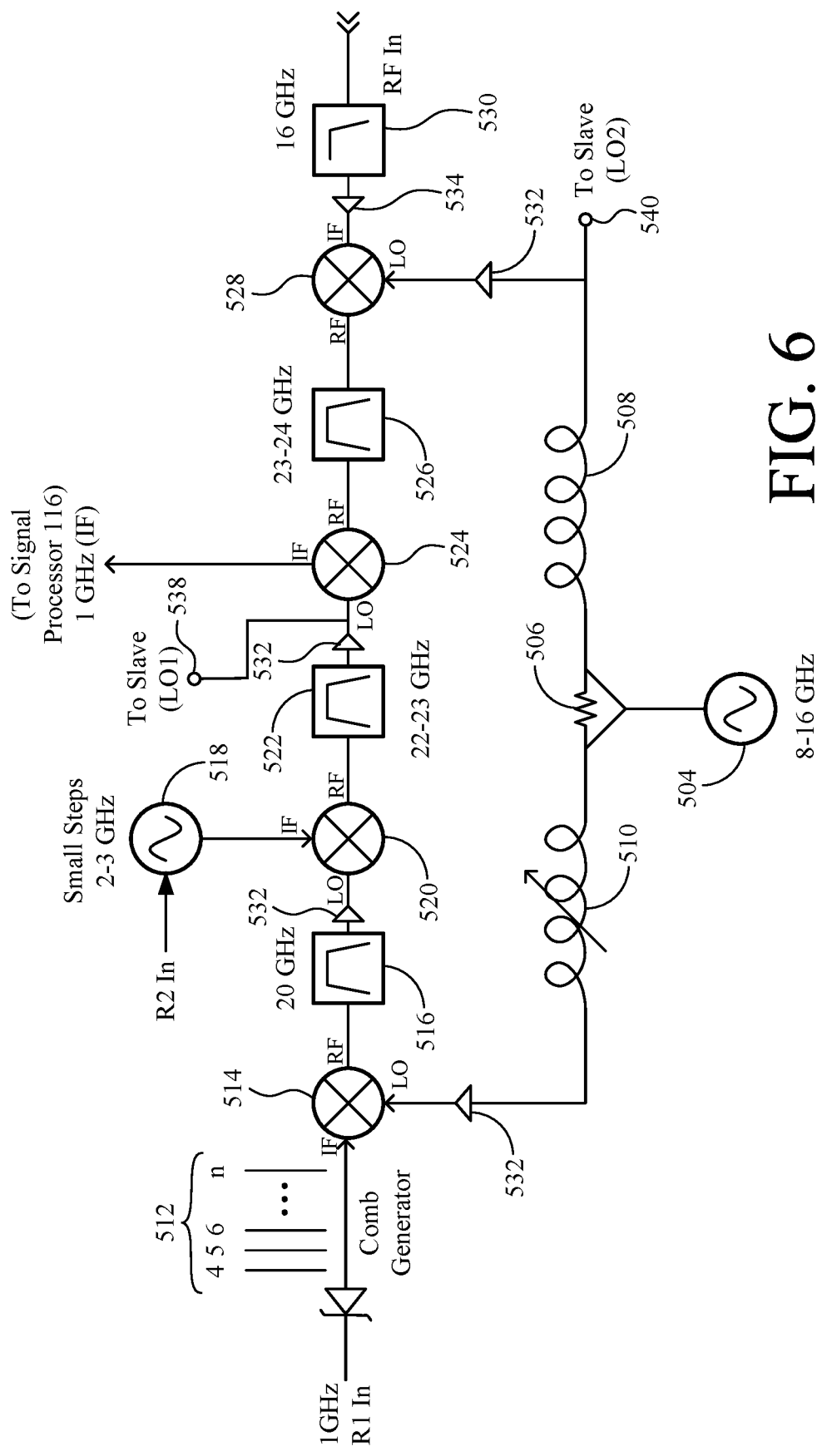
FIG. 6 is a circuit diagram showing specific example components of the receiver of FIG. 5.

FIG. 6 is a circuit diagram showing specific, example components of receiver 500.

FIG. 7 is a block diagram of an example slave up-converter 700. Slave up-converter 700 includes a linear path similar to master synthesizer 200 of FIG. 2, but not the remainder of the noise/drift canceling loop. Instead, slave up-converter 700 includes input terminals 702 and 704 for receiving the LO1 and LO2 signals, respectively, from a master circuit 102 or another slave circuit 104. Sharing the LO1 and LO2 signals between slave units 104 has the effect of sharing the master unit's harmonic generator, which delivers a significant improvement in short term phase stability between a master unit and its slave channels. The other master or slave circuit can be an up-converter circuit or a down-converter circuit. Slave up-converter 700 also includes output terminals 706 and 708 for providing the LO1 and LO2 signals, respectively, to another one of slave circuits (up-converter or down-converter) 104.

FIG. 8 is a block diagram of an example slave receiver (down-converter) 800. Slave receiver 800 includes a linear path similar to the master receiver of FIG. 5, but not the remainder of the noise/drift canceling loop. Instead, slave receiver 800 includes input terminals 802 and 804 for receiving the LO1 and LO2 signals, respectively, from a master circuit 102 or another slave circuit 104. The other master or slave circuit can be an up-converter circuit or a down-converter circuit. Slave receiver 800 also includes output terminals 806 and 808 for providing the LO1 and LO2 signals, respectively, to another one of slave circuits (up-converter or down-converter) 104.

Figure 9:
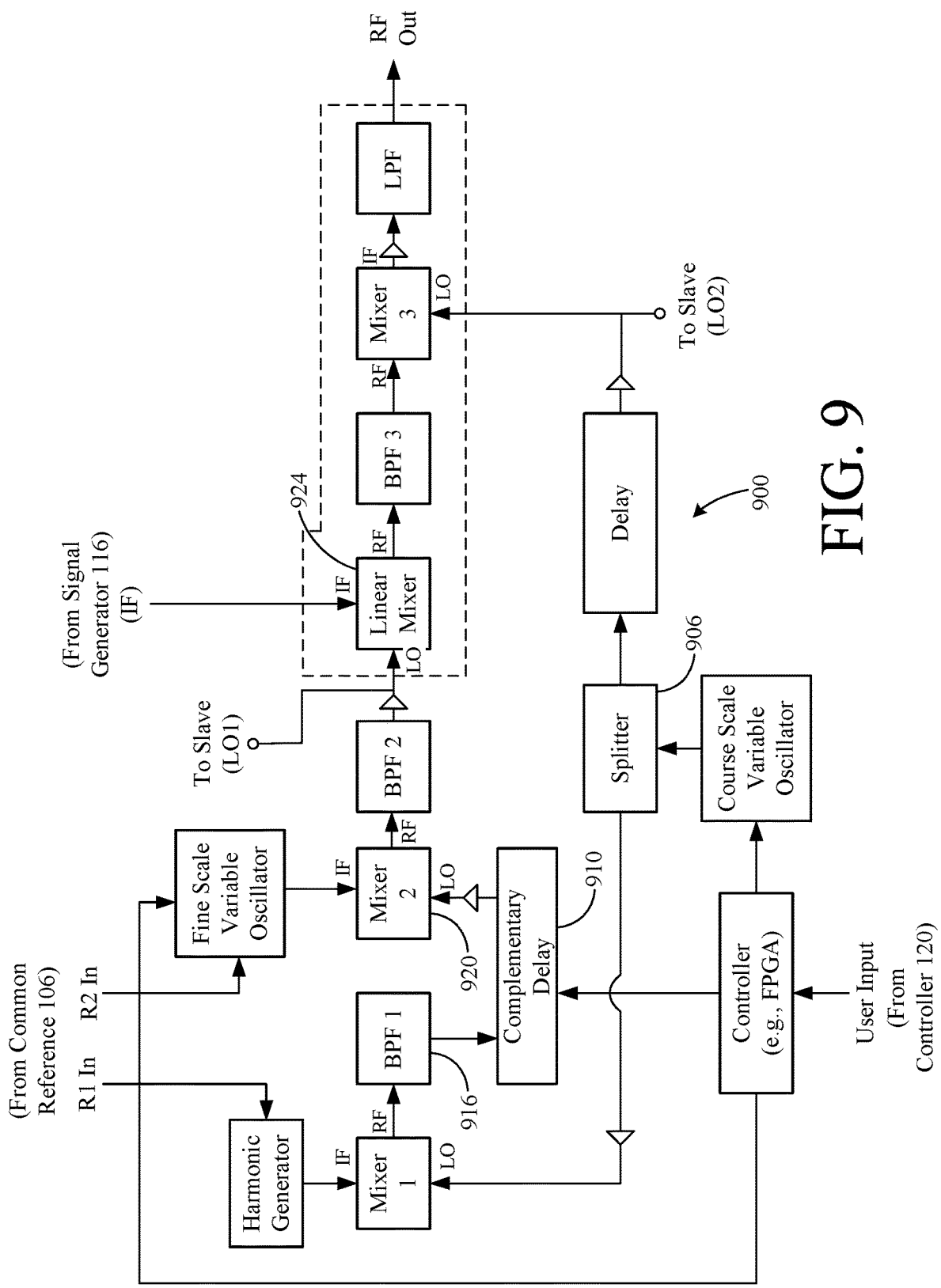
FIG. 9 is a block diagram of an alternate synthesizer.

FIG. 9 is a block diagram of an alternate synthesizer (up-converter) 900. The alternate synthesizer of FIG. 9 is similar to frequency synthesizer 200 of FIG. 2, except that a complementary delay 910 is interposed between a first band-pass filter 916 and a second mixer 920. Disposing complementary delay 910 after first band-pass filter 916 provides an advantage because complementary delay 910 can be frequency dependent and is, therefore, more precisely controllable for a narrow band of frequencies provided by first band-pass filter 916. However, complementary delay 910 can be effected anywhere between a splitter 906 and a linear mixer 924.

Figure 10:
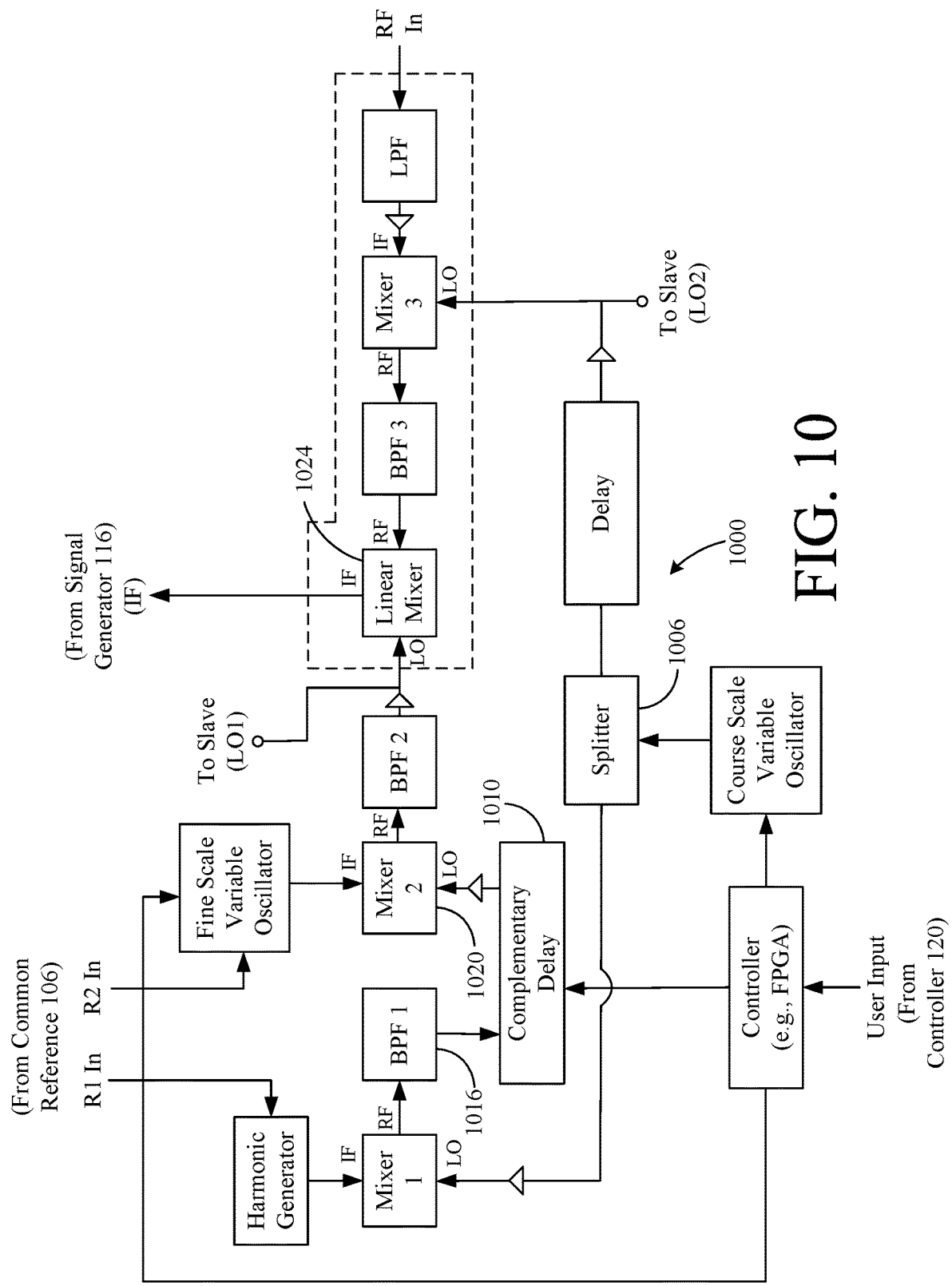
FIG. 10 is a block diagram of an alternate receiver.

FIG. 10 is a block diagram of an alternate receiver (down-converter) 1000. The down-converter of FIG. 10 is similar to the up-converter of FIG. 9, except that the linear path conducts an RF input signal in the opposite direction.

The description of particular embodiments of the present invention is now complete. Many of the described features may be substituted, altered or omitted without departing from the scope of the invention. For example, in a disclosed embodiment, the LO1 and LO2 signals are provided to a series of slave converters in a daisy-chain arrangement. However, if delay in the LO1 and LO2 signals becomes significant in a particular application, the slave connectors can be arranged in a star configuration, equalizing the electrical path lengths to each slave converter, as is shown for the reference connectors providing the R1 and R2 signals from the common reference signal generator 106 to the master synthesizer/receivers 102(1-N) in FIG. 1. Deviations from the particular embodiments shown will be apparent to those skilled in the art, particularly in view of the foregoing disclosure.

We claim:

1. A modular converter system including:
   a mounting structure adapted to receive one or more master converter modules and one or more slave converter modules;
   one or more master converter modules mounted in said mounting structure;
   one or more slave converter modules mounted in said mounting structure, each said slave converter module including a slave signal converter;
   a reference signal generator mountable in said mounting structure and operable to generate at least one reference signal (R2);
   reference connectors disposed in said mounting structure and coupled to provide said at least one reference signal (R2) to said one or more master converter modules;
   slave connectors coupled to provide slave signals from said one or more master converter modules to associated ones of said one or more slave converter modules;
   a data interface operative to communicate signals to be converted to said one or more master converter modules and to said one or more slave converter modules;
   a control interface operative to communicate frequency control signals to said one or more master converter modules; and wherein
   each said master converter module includes a master signal converter; and
   each said master signal converter includes
      a first mixer including an input coupled to said data interface for receiving a signal to be converted,
      a second mixer including an output for providing said converted signal,
      a slave output coupled to provide a slave signal (LO1) from a second input of said first mixer via one of said slave connectors, and
      a second slave output coupled to provide a second slave signal (LO2) from an input of said second mixer via another of said slave connectors.

2. The modular converter system of claim 1, wherein each master signal converter includes:
   a variable oscillator for producing a signal (CS) variable at a first scale;
   a splitter coupled to said first mixer and said second mixer to form a drift canceling loop, said splitter including an input coupled to receive said signal (CS) from said variable oscillator, a first output coupled to introduce said signal (CS) into said drift canceling loop along a first direction, and a second output coupled to introduce said signal (CS) into said drift canceling loop along a second direction opposite said first direction;
   a second variable oscillator coupled to receive said reference signal (R2) via said reference connectors and operative to produce a signal (FS) variable at a second scale finer than said first scale depending on said reference signal (R2); and
   a third mixer coupled between said splitter and said first mixer and having an input coupled to receive said signal (FS) from said second variable oscillator.

3. The modular converter system of claim 1, wherein each slave signal converter includes:
   a first mixer including an input for receiving an associated signal to be converted and a second input coupled to receive a slave signal (LO1) via an associated one of said slave connectors; and
   a second mixer including an output for providing said converted second signal and an input coupled to receive a second slave signal (LO2) via another associated one of said slave connectors.

4. The modular converter system of claim 3, wherein each slave converter module includes a plurality of said slave signal converters.

5. The modular converter system of claim 3, wherein:
   said reference signal generator is operative to generate another reference signal (R1); and
   said reference connectors are coupled to provide said another reference signal (R1) to any master converter modules present in said mounting structure.

6. The modular converter system of claim 5, wherein each said master signal converter includes:

a fourth mixer coupled between said splitter and said third mixer;
a harmonic generator having an input coupled to receive said reference signal (R1) via an associated one of said reference connectors, and having an output coupled to an input of said fourth mixer.

7. The modular converter system of claim 3, wherein said master signal converter additionally includes:
a delay device coupled between said second output of said splitter and an input of said second mixer; and
a complementary delay device coupled between said first output of said splitter and an input of said first mixer, at least one of said delay device and said complementary delay device being adjustable.

8. The modular converter system of claim 7, wherein said complementary delay device is adjusted based at least in part on a current frequency of said variable oscillator.

9. The modular converter system of claim 8, wherein said complementary delay device is adjusted based at least in part on a current frequency of said second variable oscillator.

10. The modular converter system of claim 1, wherein:
one of said slave converter modules includes at least three slave signal converters;
one of said master converter modules includes no more than one master signal converter.

11. The modular converter system of claim 1, wherein an electrical path length of every said reference connector communicating said reference signal (R2) is the same.

12. The modular converter system of claim 1, wherein:
said reference signal generator is operative to generate another reference signal (R1);
said reference connectors include a subset of reference connectors coupled to provide said another reference signal (R1) to said at least one master converter module; and
an electrical path length of every said reference connector communicating said reference signal (R2) is the same.

13. The modular converter system of claim 12, wherein an electrical path length of every said reference connector communicating said reference signal (R1) and every said reference connector communicating said reference signal (R2) is the same.

14. A rack-mounted converter system including:
a rack including mounts for one or more master converter modules and one or more slave converter modules;
one or more master converter modules mountable in said rack;
one or more slave converter modules mountable in said rack;
a reference signal generator module mountable in said rack and operable to generate at least one reference signal (R2);
reference connectors disposed in said rack and coupled to provide said at least one reference signal (R2) to said one or more master converter modules when said one or more master converter modules are mounted in said rack;
slave connectors coupled to provide slave signals from said one or more master converter modules to associated ones of said one or more slave converter modules when said master converter modules and said slave converter modules are mounted in said rack, said slave connectors including a first subset of connectors that communicate a first oscillator signal (LO1) and a second subset of connectors that communicate a second oscillator signal (LO2) from each of said master converter modules to each associated one of said slave converter modules;
a data interface operative to communicate signals to be converted to said one or more master converter modules and to said one or more slave converter modules when said one or more master converter modules and said one or more slave converter modules are mounted in said rack; and
a control interface operative to communicate frequency control signals to said one or more master converter modules when said one or more master control modules are mounted in said rack.

15. The rack-mounted converter system of claim 14, wherein:
one of said slave converter modules includes at least three slave signal converters; and
one of said master converter module includes no more than one master signal converter.

16. The rack-mounted converter system of claim 14, wherein an electrical path length of every said reference connector communicating said reference signal (R2) is the same.

17. The rack-mounted converter system of claim 14, wherein:
said reference signal generator is operative to generate another reference signal (R1);
said reference connectors include a subset of connectors coupled to communicate said another reference signal (R1) to said one or more master converter modules when said one or more master converter modules are mounted in said rack; and
an electrical path length of every said reference connector communicating said reference signal (R1) is the same.

18. The rack-mounted converter system of claim 17, wherein an electrical path length of every said reference connector communicating said reference signals (R1) and (R2) is the same.

* * * * *